United States Patent
Singh et al.

(10) Patent No.: US 10,295,416 B2
(45) Date of Patent: May 21, 2019

(54) TEMPERATURE SENSING CIRCUIT WITH TEMPERATURE COEFFICIENT ESTIMATION AND COMPENSATION USING TIME VARIABLE SUBSTRATE HEATING

(71) Applicant: STMicroelectronics International N.V., Amsterdam (NL)

(72) Inventors: Pratap Narayan Singh, Chahania Chandauli (IN); Nitin Bansal, Gurgaon (IN)

(73) Assignee: STMicroelectronics International N.V., Amsterdam (NL)

(*) Notice: Subject to any disclaimer, the term of this patent is extended or adjusted under 35 U.S.C. 154(b) by 212 days.

(21) Appl. No.: 15/289,360

(22) Filed: Oct. 10, 2016

(65) Prior Publication Data

US 2018/0100774 A1    Apr. 12, 2018

(51) Int. Cl.
  *G01K 7/01* (2006.01)
  *G01K 15/00* (2006.01)
  *H01L 23/34* (2006.01)

(52) U.S. Cl.
  CPC ............. *G01K 15/005* (2013.01); *G01K 7/01* (2013.01); *H01L 23/34* (2013.01)

(58) Field of Classification Search
  CPC ........................................ G01K 15/005–15/007
  See application file for complete search history.

(56) References Cited

U.S. PATENT DOCUMENTS

| | | | | |
|---|---|---|---|---|
| 6,215,635 B1* | 4/2001 | Nguyen | .................. | G01K 7/01 |
| | | | | 361/103 |
| 7,181,357 B1* | 2/2007 | Rotem | .................. | G01K 15/00 |
| | | | | 374/110 |
| 7,484,886 B2 | 2/2009 | Clark, Jr. et al. | | |
| 7,579,860 B2* | 8/2009 | Deken | ...................... | G05F 3/30 |
| | | | | 323/314 |
| 7,906,829 B2 | 3/2011 | Tai | | |
| 8,241,925 B2* | 8/2012 | Saether | ................. | H01L 23/345 |
| | | | | 257/E21.001 |
| 9,442,025 B2* | 9/2016 | Yang | ....................... | G01K 7/01 |
| 9,607,906 B2* | 3/2017 | Pontarollo | ............. | H01L 22/14 |
| 9,651,981 B2* | 5/2017 | Lindholm | ............ | H01L 23/345 |
| 2014/0140364 A1 | 5/2014 | Charles et al. | | |
| 2015/0369674 A1* | 12/2015 | Ma | ........................ | G01K 7/015 |
| | | | | 374/1 |
| 2016/0049341 A1 | 2/2016 | Pontarollo et al. | | |

OTHER PUBLICATIONS

Bakker, Anton: "High-Accuracy CMOS Smart Temperature Sensors," Apr. 17, 2000, (cover plus pp. 37-61).

(Continued)

*Primary Examiner* — Clayton E. LaBalle
*Assistant Examiner* — Leon W Rhodes, Jr.
(74) *Attorney, Agent, or Firm* — Crowe & Dunlevy

(57) ABSTRACT

A localized substrate heater is configured to apply variable substrate heating to an integrated bipolar transistor. The base-to-emitter voltage (Vbe) of that bipolar transistor at varying substrate temperature settings is sensed, with the sensed Vbe processed to determine temperature coefficients of the bipolar transistor. The bipolar transistor may, for example, be a circuit component of an integrated temperature sensing circuit.

29 Claims, 2 Drawing Sheets

(56) References Cited

OTHER PUBLICATIONS

Lo, et al: "A High-Accuracy, High-Resolution, and Low-Cost All-Digital Temperature Sensor Using a Voltage Compensation Ring Oscillator," IEEE Sensors Journal, vol. 16, No. 1, Jan. 1, 2016 (pp. 43-52).
Pertijs, Michiel A. P., et al: "A CMOS Smart Temperature Sensor with a 3sigma Inaccuracy of +/−0.1oC From -55oC to 125oC," IEEE Journal of Solid State Circuits, vol. 40, No. 12, Dec. 2005 (pp. 2805-2815).
Pertijs, Michiel A. P., et al: "Low-Cost Calibration Techniques for Smart Temperature Sensors," IEEE Sensors Journal, vol. 10, No. 6, Jun. 2010 (pp. 1098-1105).
Pertijs, Michiel A.P., et al: "Transistor Temperature Measurement for Calibration of Integrated Temperature Sensors," IEEE Instrumentation and Measurement Technology Conf., May 21-23, 2002 (pp. 755-759).
Pertijs, M.A.P., et al: "Voltage Calibration of Smart Temperature Sensors," IEEE Sensors Conference, 2008 (pp. 756-759).
Sonmez, Ugur, et al: "A 0.008-mm2 Area-Optimized Thermal-Diffusivity-Based Temperature Sensor in 160-nm CMOS for SoC Thermal Monitoring," IEEE European Solid State Circuits Conference (ESSCIRC), ESSCIRC 2014—40th (pp. 395-398).
Sonmez, Ugur, et al: "1650um2 Thermal-Diffusivity Sensors with Inaccuracies Down to +/−0.75oC in 40nm CMOS," 2016 IEEE Intern. Solid-State Circuits Conf., 2016 (pp. 206-208).

\* cited by examiner

TEMPERATURE SENSING CIRCUIT WITH TEMPERATURE COEFFICIENT ESTIMATION AND COMPENSATION USING TIME VARIABLE SUBSTRATE HEATING

TECHNICAL FIELD

The present invention relates to a temperature coefficient estimation and compensation for a temperature sensing circuit and, in particular, to the use of variable substrate heating to alter the temperature of circuit components of the temperature sensing circuit during the process for determining temperature coefficient estimation and compensation.

BACKGROUND

On-chip temperature sensing is an important technical feature of many integrated circuits. Temperature sensors are used to monitor temperature change for the purpose, for example, of detecting an overheating or system thermal overrun condition. Protective measures may then be taken when the temperature sensor detects an abnormal temperature condition. In another example, the output from an on-chip temperature sensor may be used to optimize the frequency of a clock signal generated by a clocking circuit or the voltage generated by a voltage generator circuit. It is critical that the output of the temperature sensor (i.e., the digital or analog signal indicative of sensed temperature) possess linearity and accuracy. For example, industrial temperature monitoring applications or temperature control loop in integrated circuits often require temperature accuracy at or in excess of 0.1° C. To accomplish this goal, it is critical that the temperature sensor be properly calibrated. Un-calibrated temperature sensors may, for example, have an accuracy of ±5° C.

The calibration of an on-chip temperature sensor typically requires the external input of a precise operating parameter such as temperature or voltage. One concern in the prior art is time required for the externally input precise operating parameter to stabilize before the calibration process can be initiated. As an example, an integrated circuit chip can be placed in a test oven for the application of a precise temperature. The time taken to bring the oven up to the desired temperature for calibration, as well as the overall process for calibration, adds significantly to the cost of chip production. This cost is further increased if the calibration operation requires multiple points of calibration input (i.e., calibration testing performed at different temperatures).

Another concern with calibration is the difficulty in controlling the accuracy of the temperature environment for calibration. In an integrated circuit production environment it is difficult and expensive to control this accuracy any better than ±1° C. The high thermal constant of such accurate calibration equipment further increases the time required to complete the calibration process, and this results in a corresponding increase in production cost.

There is accordingly a need in the art to address the foregoing issues with the calibration of an on-chip temperature sensor.

SUMMARY OF THE INVENTION

It is to be understood that both the foregoing general description and the following detailed description are exemplary and explanatory and are intended to provide further explanation of the invention as claimed.

In an embodiment, an integrated circuit comprises: a semiconductor substrate; and a temperature sensitive circuit integrated on and in said substrate. The temperature sensitive circuit includes: a first current source configured to generate a first current; a first bipolar transistor configured as a diode-connected device and biased by said first current to exhibit a first base-to-emitter voltage (Vbe); wherein said first bipolar transistor is located in a portion of said semiconductor substrate; a substrate heating circuit configured to heat said portion of semiconductor substrate in response to a temperature control signal; an analog-to-digital converter (ADC) circuit having an input coupled to the first bipolar transistor and configured to convert the first Vbe to a first digital signal; and a digital control circuit configured to generate said temperature control signal and cause the substrate heating circuit to heat said portion to two different temperatures, said digital control circuit further configured to receive the first digital signal from said ADC circuit in response to heating at each of said two different temperatures.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 1:
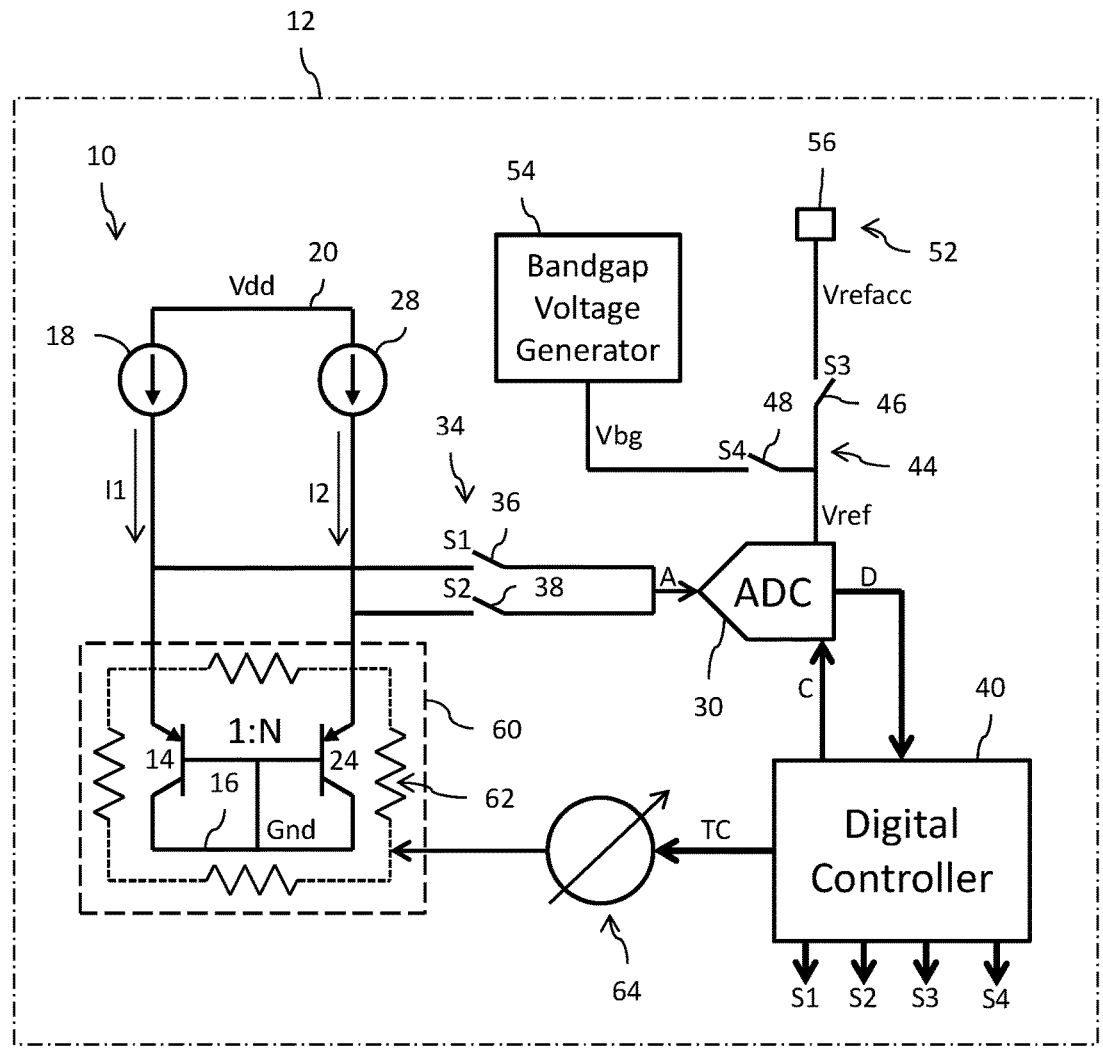
FIG. 1 is a circuit diagram for a temperature sensing circuit.

Reference is now made to FIG. 1 showing a circuit diagram for a temperature sensing circuit 10. The circuit 10 is integrated in and on a semiconductor substrate 12. The circuit includes a first bipolar transistor 14 in a diode-connected configuration with its base connected to its collector. The base and collector of transistor 14 are further connected to a ground (Gnd) reference node 16. The circuit further includes a second bipolar transistor 24 in a diode-connected configuration with its base connected to its collector. The base and collector of transistor 24 are further connected to the ground reference node 16. The transistors 14 and 24 have un-equal emitter areas. The ratio of the emitter area of transistor 14 to the emitter area of transistor 24 is 1:N.

A first current source 18 is coupled between a supply voltage (Vdd) node 20 and the emitter of transistor 14 to provide a bias current I1. A second current source 28 is coupled between the supply voltage node 20 and the emitter of transistor 24 to provide a bias current I2. In a preferred embodiment, the currents I1 and I2 are equal.

An analog-to-digital converter (ADC) 30 has a first input that is selectively connected to the emitters of the transistors 14 and 24 by a first switching circuit 34. The first switching circuit 34 includes a first switch 36 connected between the first input of the ADC 30 and the emitter of transistor 14 and a second switch 38 connected between the first input of the ADC 30 and the emitter of transistor 24. The open/closed state of the first switch 36 is controlled by a switch control signal 51 and the open/closed state of the second switch 38 is controlled by a switch control signal S2.

The ADC 30 further includes a second input configured to receive a reference voltage Vref. The reference voltage Vref is supplied to the second input of the ADC 30 by a second switching circuit 44. The second switching circuit 44 includes a first switch 46 connected between the second input of the ADC 30 and a source 52 of an accurate reference voltage Vrefacc and a second switch 48 connected between the second input of the ADC 30 and a source 54 of a bandgap reference voltage Vbg. The open/closed state of the first switch 46 is controlled by a switch control signal S3 and the open/closed state of the second switch 48 is controlled by a switch control signal S4.

The source 52 of the accurate reference voltage Vrefacc may, for example, be an off-chip (external) voltage generator having an output voltage that is applied to a pad 56 that is electrically connected to the first switch 46. The source 54 of the bandgap reference voltage Vbg may, for example, comprise an on-chip bandgap reference voltage generator circuit. The circuit configuration and operation of such a bandgap reference voltage generator circuit are well known to those skilled in the art.

The switches 36, 38, 46 and 48 may, for example, comprise transistor switches or transistor pass gates as known to those skilled in the art. The switch control signals S1, S2, S3 and S4 are accordingly applied to the gate (or control) terminals of the corresponding transistor switch or pass gate.

The ADC 30 functions to convert the analog voltage A present at the first input to a digital data value D produced at the output of the ADC 30. When the first switch 36 is in the closed state, the analog voltage A is equal the base-to-emitter voltage (Vbe) of the transistor 14, and the digital data value D is digital representation of that voltage Vbe. When the second switch 38 is in the closed state, the analog voltage A is equal the base-to-emitter voltage (Vbe) of the transistor 24, and the digital data value D is digital representation of that voltage Vbe. The conversion operation is triggered by the assertion of a control signal C applied to a third input of the ADC 30.

A digital control circuit 40 has an input coupled to receive the digital data values D output from the ADC 30. Those digital data values D are processed by the digital control circuit 40 in a manner to be described in more detail herein for the purpose of determining temperature, estimating temperature coefficients and performing temperature compensation. The digital control circuit 40 further generates the switch control signals S1, S2, S3 and S4 and the ADC control signal C.

The transistors 14 and 24 are integrated in a portion 60 of the substrate 12. Temperature of that portion 60 of the substrate may be controlled by a substrate heater 62. The substrate heater 62 may be formed, for example, of a plurality of substrate resistors coupled in series, parallel or a combination of series and parallel. Reference is made to Unites States Patent Application Publication No. 2016/0049341 (incorporated herein by reference) for an example of a structural implementation of the portion 60 with substrate heater 62.

The operation of the substrate heater 62 is controlled by a heater control circuit 64. The heater control circuit 64 may, for example, comprise a variable voltage generator circuit. The variable voltage output from the heater control circuit 64 is applied to the circuit network of substrate resistors for the substrate heater 62. In response to the applied variable voltage, the substrate heater 62 heats the portion 60 of the substrate 12 to a corresponding temperature. By varying the variable voltage output from the heater control circuit 64, different substrate temperatures can be applied to the portion 60 of the substrate 12. The digital control circuit 40 further generates a temperature control signal TC, and the heater control circuit 64 responds to a value of the temperature control signal TC to set the variable voltage output and control substrate temperature. Because the portion 60 of the substrate 12 is so small (for example, on the order of 100 $\mu m^2$ for a substrate 12 area on the order of few $mm^2$, the substrate heater 62 can quickly bring the portion 60 to the desired temperature. The area of the portion 60 is accordingly substantially smaller than the area of the substrate 12.

Figure 2:
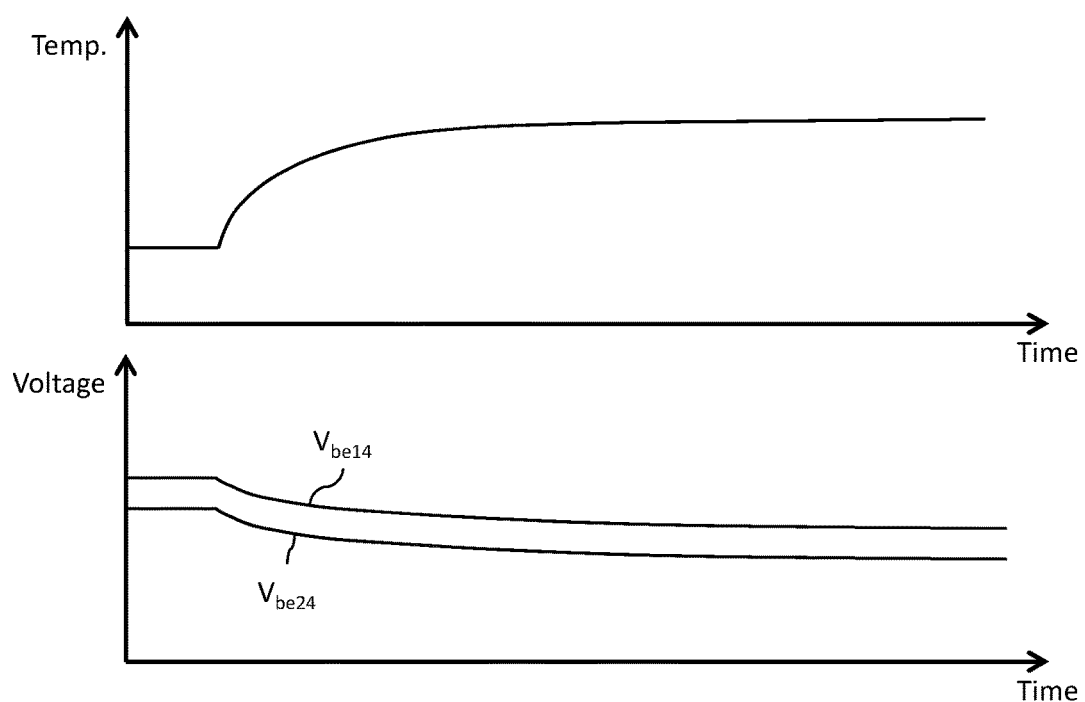
FIG. 2 illustrates variation in base-to-emitter voltage responsive to temperature change due to time variable substrate heating.

The base-to-emitter voltage Vbe of a bipolar transistor as a function of temperature T is given by the following equation when combined with two bipolar transistors (see, also, FIG. 2):

$$Vbe(T) = Vbg\left(1 - \frac{T}{To}\right) + Vbe0\left(\frac{T}{To}\right) - \frac{(\gamma - \alpha)kT}{q}\ln\left(\frac{T}{To}\right) \qquad \text{Eq. 1}$$

Where: Vbg is the bandgap voltage of silicon; T is absolute temperature, To is a reference temperature, Vbe0 is the bandgap voltage at the reference temperature To, k is Boltzmann's constant, $\gamma$ and $\alpha$ are constants and q elementary electronic charge.

The digital control circuit 40 may further operate to perform numerical curve fitting of Equation 1 as a tracking polynomial with Vbg, Vb0 and ($\gamma-\alpha$) as variables. Since Vbe(T) changes with temperature, an estimator can be activated to minimize the error E and estimate the values of Vbg, Vb0 and ($\gamma-\alpha$). The estimator is based on three sets of linear equations. The value for To is assumed to be a constant between the calibration temperature range. The values of (T/To) and ln(T/To) are approximated to be constants assuming an approximate temperature calculated from the determined voltage $\Delta$Vbe. Thus, Equation 1 can be reduced to a linear equation of the form:

$$Y = aX1 + bX2 + cX3 \qquad \text{Eq. 2}$$

Where: X1, X2, and X3 are constants at each set temperature, Y is the Vbe of the transistor as measured by the ADC 30, a is the parameter Vbg, b is the parameter Vb0 and c is the parameter ($\gamma-\alpha$).

If three different temperatures are set by the digital control circuit 40 using the substrate heater 62, and the transistor Vbe can be measured at each of those temperatures using the ADC 30. This operation is performed by actuating switch 46 with control signal S3 to apply the accurate reference voltage Vrefacc to the ADC 30 and further actuating one of the switches 36 or 38 with control signal S1 or S2 to sense the Vbe of selected transistor 14 (i.e., Vbe14 or Vbe24). The digital values of the measured Vbe voltages (Vbe12 or Vbe24) output from the ADC 30 at the three set temperatures are substituted into Equation 3, and the resulting three equations can be used to solve for the parameters Vbg, Vb0 and ($\gamma-\alpha$). A moving average is applied in constants so as to improve accuracy.

The following shows an example using Equation 1:

Apply current through the heater to effectuate temperature change at three different temperature points T1, T2 and T3, and this will give:

$$Vbe(T1) = Vbg\left(1 - \frac{T1}{To}\right) + Vbe0\left(\frac{T1}{To}\right) - \frac{(\gamma - \alpha)kT1}{q}\ln\left(\frac{T1}{To}\right) \qquad \text{Eq. 1a}$$

-continued $$Vbe(T2) = Vbg\left(1 - \frac{T2}{To}\right) + Vbe0\left(\frac{T2}{To}\right) - \frac{(\gamma-\alpha)kT2}{q}\ln\left(\frac{T2}{To}\right) \quad \text{Eq. 1b}$$

$$Vbe(T3) = Vbg\left(1 - \frac{T3}{To}\right) + Vbe0\left(\frac{T3}{To}\right) - \frac{(\gamma-\alpha)kT3}{q}\ln\left(\frac{T3}{To}\right) \quad \text{Eq. 1c}$$

With To assumed to be equal to 200° K, and the Vbe voltages and temperatures known, Equations 1a-1c can be reduced to:

$$Y1 = a1\,Vbg + b1\,Vbeo + c1(\gamma-\alpha) \quad \text{Eq. 2a}$$

$$Y2 = a2\,Vbg + b2\,Vbeo + c2(\gamma-\alpha) \quad \text{Eq. 2b}$$

$$Y3 = a3\,Vbg + b3\,Vbeo + c3(\gamma-\alpha) \quad \text{Eq. 2c}$$

We now have three equations with three unknown coefficients: Vbg, Vbeo and $(\gamma-\alpha)$.

Using numerical methods well known to those skilled in the art, the equations can be solved to find Vbg, Vbeo and $(\gamma-\alpha)$. One possible numerical method is Cramer's Rule.

To achieve better accuracy in estimating Vbg, Vbeo and $(\gamma-\alpha)$, multiple reading in excess of the three noted above can be taken. A moving average can then be applied to the readings and the coefficient estimation process so as to improve accuracy.

It will be noted that an advantage of the foregoing processes for parameter determination that calibration can be achieved without any external temperature input. The circuit and process need only the application of the accurate reference voltage Vrefacc.

The foregoing processes for solving for the bipolar transistor parameters allows for temperature coefficients to be estimated with a high degree of accuracy. This process is applicable to any circuit using a bipolar transistor or diodes. Calibration of thermal sensors, bandgap reference voltage generators is supported. Curvature correction operations as known in the art are also supported.

After the calibration phase is completed, the digital control circuit 40 deactuates the switch 46 with control signal S3 and actuates the switch 48 with control signal S4 to apply the bandgap voltage Vbg as the reference voltage for the ADC 30. With the parameters Vbg, Vb0 and $(\gamma-\alpha)$ previously determined as noted above, the circuitry is now enabled for operation as a calibrated temperature sensor.

Ambient Temperature Measurement:

The measured temperature to reference ratio is solved in accordance with the following:

$$D = \frac{mV_T \times \ln N}{Vref} \quad \text{Eq. 3}$$

Where: $Vref = Vbe + mV_T \ln N$ Eq. 4

Where: m is a constant multiplication factor, N is the ratio of areas of the bipolar transistors (or the ratio of the currents), Vt is thermal voltage (i.e., kT/q, where k is Boltzmann's constant, T is temperature and q is the charge constant.

Substituting for Vref:

$$D = \frac{mV_T \times \ln N}{Vbe + mV_T \ln N} \quad \text{Eq. 5}$$

Now, expanding Vbe:

$$D = \frac{mV_T \times \ln N}{Vbg\left(1 - \frac{T}{To}\right) + Vbeo\frac{T}{To} + (\gamma-\alpha)V_T \ln N \frac{T}{To} + mV_T \ln N} \quad \text{Eq. 6}$$

Replacing $$V_T = \frac{kT}{q},$$

and rearranging to solve for temperature:

$$T = \frac{DVbg}{(1-D)m\frac{k}{q}\ln N + \frac{D}{To}(Vbg - Vbeo) - (\gamma-\alpha)D\frac{k}{q}\ln\left(\frac{T}{To}\right)} \quad \text{Eq. 7}$$

From Eq. 3 above, T can be estimated as:

$$T = (DxVref)\left(\frac{k}{q}\ln(N)\right)$$

So, this estimated temperature can be replaced in Eq. 7 at ln(T/To), and thus:

$$T = \frac{DVbg}{(1-D)m\frac{k}{q}\ln N + \frac{D}{To}(Vbg - Vbeo) - (\gamma-\alpha)D\frac{k}{q}\ln\left(\frac{T}{T0}\right)} \quad \text{Eq. 8}$$

Where: T0 can be fixed at any suitable temperature, such as 200° K.

As Vbg, Vbeo and $(\gamma-\alpha)$ are known from the estimation described above, correction can be applied to achieve a higher temperature accuracy.

During ambient temperature measurement, the digital control circuit 40 actuates the switch 48 with control signal S4 to apply the bandgap voltage Vbg as the reference voltage Vref. The transistor Vbe is then measured by actuating one of the switches 36 or 38 with control signal S1 or S2 to sense the Vbe of selected transistor 14 (i.e., Vbe14 or Vbe24). The digital value of the measured Vbe voltage (Vbe12 or Vbe24) output from the ADC 30 is then substituted into the equations above and a calculation is performed to solve for the ambient temperature.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:
1. An integrated circuit, comprising:
   a semiconductor substrate; and
   a temperature sensitive circuit integrated on and in said substrate, said temperature sensitive circuit including:
   a first current source configured to generate a first current;

a first bipolar transistor configured as a diode-connected device and biased by said first current to exhibit a first base-to-emitter (Vbe) voltage;

wherein said first bipolar transistor is located in a portion of said semiconductor substrate;

a substrate heating circuit configured to heat said portion of semiconductor substrate in response to a temperature control signal;

an analog-to-digital converter (ADC) circuit having an input coupled to the first bipolar transistor and configured to convert the first Vbe voltage to a first digital signal; and a digital control circuit configured to generate said temperature control signal and cause the substrate heating circuit to heat said portion to two different temperatures, receive the first digital signal from said ADC circuit in response to heating at each of said two different temperatures, and process said first digital signals for the first Vbe voltage at each of said two different temperatures to calculate temperature coefficients of operation of said first bipolar transistor by numerically solving at least two linear equations respectively set equal to the first digital signals, where each linear equation has the temperature coefficients of operation as unknowns.

2. The integrated circuit of claim 1, further comprising a switching circuit including a first switch actuated by said digital control circuit in a calibration mode during conversion of the first Vbe voltage to supply said ADC circuit with a reference voltage derived from an off-chip accurate voltage supply.

3. The integrated circuit of claim 2, wherein said switching circuit further comprises a second switch actuated by said digital control circuit in an ambient temperature sensing mode to supply said ADC circuit with a bandgap reference voltage.

4. The integrated circuit of claim 3, wherein said bandgap reference voltage is generated by an on-chip bandgap reference voltage generator circuit.

5. The integrated circuit of claim 1, further comprising:
a second current source configured to generate a second current; and
a second bipolar transistor configured as a diode-connected device and biased by said second current to exhibit a second Vbe;
wherein said first and second bipolar transistors are located in said portion of said semiconductor substrate.

6. The integrated circuit of claim 5, where said input of the ADC circuit is further coupled to the second bipolar transistor and configured to convert the second Vbe voltage to a second digital signal.

7. The integrated circuit of claim 6, wherein said digital control circuit is further configured to receive the first and second digital signals from said ADC circuit in response to heating at each of said two different temperatures and calculate from said first and second digital signals a delta Vbe voltage between said first and second bipolar transistors.

8. The integrated circuit of claim 7, further comprising processing of the first digital signal for said first Vbe voltage and the delta Vbe voltage at each of said two different temperatures to calculate temperature coefficients of operation of said first bipolar transistor.

9. The integrated circuit of claim 6, further comprising processing of the first digital signal for said first Vbe voltage and the second digital signal for said second Vbe voltage at each of said two different temperatures to calculate temperature coefficients of operation of said first bipolar transistor.

10. The integrated circuit of claim 6, further comprising a switching circuit including:
a first switch coupled between the first bipolar transistor and the input of the ADC circuit; and
a second switch coupled between the second bipolar transistor and the input of the ADC circuit;
wherein actuation of said first and second switches is controlled by said digital control circuit.

11. The integrated circuit of claim 1, wherein each linear equation is a reduction of the equation:

$$Vbe(T) = Vbg\left(1 - \frac{T}{To}\right) + Vbe0\left(\frac{T}{To}\right) - \frac{(\gamma - \alpha)kT}{q}\ln\left(\frac{T}{To}\right)$$

defining the first Vbe voltage as a function of temperature, where T is absolute temperature, To is a reference temperature, k is Boltzmann's constant, and q is elementary electronic charge, and
wherein the temperature coefficients are selected from the group consisting of: Vbg which is the bandgap voltage of silicon; Vbeo which is the bandgap voltage at the reference temperature To, and $\gamma$-$\alpha$ which is a constant.

12. The integrated circuit of claim 1, wherein each linear equation is of the form:

$$Y = a\text{Vbg} + b\text{Vbeo} + c(\gamma-\alpha)$$

wherein Y is the first Vbe voltage, a, b and c are constants dependent on a ratio of absolute temperature (T) to a reference temperature (To), and the temperature coefficients are selected from the group consisting of: Vbg which is the bandgap voltage of silicon; Vbeo which is the bandgap voltage at the reference temperature To, and $\gamma$-$\alpha$ which is a parameter.

13. A method, comprising:
heating a portion of a semiconductor substrate to at least two different temperatures, wherein said portion includes a first bipolar transistor configured as a diode-connected device and biased by a first current to exhibit a first base-to-emitter (Vbe) voltage;
sensing the first Vbe voltage at each of the at least two different temperatures;
converting the sensed first Vbe voltages to corresponding first digital signals;
processing said first digital signals for the first Vbe voltages at each of said two different temperatures to calculate temperature coefficients of operation of said first bipolar transistor by numerically solving at least two linear equations respectively set equal to the first digital signals, where each linear equation has the temperature coefficients of operation as unknowns.

14. The method of claim 13, wherein converting comprises analog to digital converting with respect to a reference voltage, wherein said reference voltage is derived from an off-chip accurate voltage supply for calculation of the temperature coefficients.

15. The method of claim 14, further comprising:
applying an ambient temperature to the semiconductor substrate;
sensing a further Vbe voltage at the ambient temperature;
converting the sensed further Vbe voltage to a corresponding digital signal;

processing said corresponding digital signal to make an ambient temperature detection.

16. The method of claim 15, further comprising applying a bandgap reference voltage generated by an on-chip bandgap reference voltage generator circuit as the reference voltage during ambient temperature detection.

17. The method of claim 13, wherein said portion includes a second bipolar transistor configured as a diode-connected device and biased by a second current to exhibit a second Vbe voltage, further comprising:
   sensing the second Vbe voltage at each of the at least two different temperatures; and
   converting the sensed Vbe voltages to corresponding second digital signals.

18. The method of claim 17, further comprising processing said first and second digital signals to calculate a delta Vbe voltage between said first and second bipolar transistors.

19. The method of claim 18, further comprising processing of the first digital signal for said first Vbe voltage and the delta Vbe voltage at each of said at least two different temperatures to calculate temperature coefficients of operation of said first bipolar transistor.

20. The method of claim 17, further comprising processing of the first digital signal for said first Vbe voltage and the second digital signal for said second Vbe voltage at each of said at least two different temperatures to calculate temperature coefficients of operation of said first bipolar transistor.

21. The method of claim 13, wherein each linear equation is a reduction of the equation:

$$Vbe(T) = Vbg\left(1 - \frac{T}{To}\right) + Vbe0\left(\frac{T}{To}\right) - \frac{(\gamma - \alpha)kT}{q}\ln\left(\frac{T}{To}\right)$$

defining the first Vbe voltage as a function of temperature, where T is absolute temperature, To is a reference temperature, k is Boltzmann's constant, and q is elementary electronic charge, and
   wherein the temperature coefficients are selected from the group consisting of: Vbg which is the bandgap voltage of silicon; Vbeo which is the bandgap voltage at the reference temperature To, and γ-α which is a parameter.

22. The method of claim 13, wherein each linear equation is of the form:

Y=aVbg+bVbeo+c(γ-α)

wherein Y is the first Vbe voltage, a, b and c are constants dependent on a ratio of absolute temperature (T) to a reference temperature (To), and the temperature coefficients are selected from the group consisting of: Vbg which is the bandgap voltage of silicon; Vbeo which is the bandgap voltage at the reference temperature To, and γ-α which is a parameter.

23. An integrated circuit, comprising:
   a semiconductor substrate; and
   a temperature sensitive circuit integrated on and in said substrate, said temperature sensitive circuit including:
      a first current source configured to generate a first current;
      a first bipolar transistor configured as a diode-connected device and biased by said first current to exhibit a first base-to-emitter (Vbe) voltage;
      wherein said first bipolar transistor is located in a portion of said semiconductor substrate;
      a substrate heating circuit configured to heat said portion of semiconductor substrate in response to a temperature control signal;
      an analog-to-digital converter (ADC) circuit having an input coupled to the first bipolar transistor and configured to convert the first Vbe voltage to a first digital signal;
      a switching circuit including a first switch that when actuated supplies said ADC circuit with a reference voltage derived from an off-chip accurate voltage supply; and
      a digital control circuit configured to operate in a calibration mode to: actuate the first switch, generate said temperature control signal to cause the substrate heating circuit to heat said portion to two different temperatures, and receive the first digital signal from said ADC circuit in response to heating at each of said two different temperatures.

24. The integrated circuit of claim 23, wherein the digital control circuit is further configured in the calibration mode to process said first digital signals to calculate temperature coefficients of operation of said first bipolar transistor.

25. The integrated circuit of claim 23, wherein said switching circuit further includes a second switch that when actuated supplies said ADC circuit with a bandgap reference voltage, said digital control circuit further configured to operate in an ambient temperature sensing mode to actuate the second switch, receive the first digital signal from said ADC circuit and calculate ambient temperature from the first digital signal.

26. The integrated circuit of claim 25, wherein said bandgap reference voltage is generated by an on-chip bandgap reference voltage generator circuit.

27. A method, comprising:
   heating a portion of a semiconductor substrate to at least two different temperatures, wherein said portion includes a first bipolar transistor configured as a diode-connected device and biased by a first current to exhibit a first base-to-emitter (Vbe) voltage;
   sensing the first Vbe voltage at each of the at least two different temperatures;
   converting the sensed Vbe voltages to corresponding first digital signals, wherein converting comprises analog to digital converting with respect to a reference voltage, wherein said reference voltage is derived from an off-chip accurate voltage supply; and
   processing said first digital signals for the first Vbe voltages at said at least two different temperatures to calculate temperature coefficients of operation of said first bipolar transistor.

28. The method of claim 27, further comprising:
   applying an ambient temperature to the semiconductor substrate;
   sensing a further Vbe voltage at the ambient temperature;
   converting the sensed further Vbe voltage to a corresponding digital signal;
   processing said corresponding digital signal to make an ambient temperature detection.

29. The method of claim 28, further comprising applying a bandgap reference voltage generated by an on-chip bandgap reference voltage generator circuit as the reference voltage during ambient temperature detection.

* * * * *

UNITED STATES PATENT AND TRADEMARK OFFICE
CERTIFICATE OF CORRECTION

PATENT NO. : 10,295,416 B2
APPLICATION NO. : 15/289360
DATED : May 21, 2019
INVENTOR(S) : Pratap Narayan Singh et al.

Page 1 of 1

It is certified that error appears in the above-identified patent and that said Letters Patent is hereby corrected as shown below:

In the Specification
At Column 2, Line 66, please replace the term [[ 51 ]] with the term -- S1 --

In the Claims
At Column 8, Claim 11, Line 26, please replace [[ Vbeo ]] with -- Vbe0 --
At Column 8, Claim 12, Line 37, please replace [[ Vbeo ]] with -- Vbe0 --
At Column 9, Claim 21, Line 42, please replace [[ Vbeo ]] with -- Vbe0 --
At Column 9, Claim 22, Line 52, please replace [[ Vbeo ]] with -- Vbe0 --

Signed and Sealed this
Second Day of June, 2020

Andrei Iancu
*Director of the United States Patent and Trademark Office*